US012592275B2

(12) United States Patent
Lee et al.

(10) Patent No.: US 12,592,275 B2
(45) Date of Patent: Mar. 31, 2026

(54) MEMORY STRUCTURE AND CONTROL METHOD FOR REDUCING LAYOUT AREA OF MEMORY DEVICE

(71) Applicant: MACRONIX International Co., Ltd., Hsinchu (TW)

(72) Inventors: Feng-Min Lee, Hsinchu City (TW); Yu-Yu Lin, New Taipei City (TW); Po-Hao Tseng, Taichung City (TW); Yu-Hsuan Lin, Taichung City (TW); Wei-Lun Weng, Tainan City (TW); Wei-Fu Wang, Keelung City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 227 days.

(21) Appl. No.: 18/407,453

(22) Filed: Jan. 9, 2024

(65) Prior Publication Data

US 2025/0226027 A1     Jul. 10, 2025

(51) Int. Cl.
*G11C 11/4096* (2006.01)
*G11C 5/06* (2006.01)
*G11C 11/4097* (2006.01)

(52) U.S. Cl.
CPC .......... *G11C 11/4096* (2013.01); *G11C 5/063* (2013.01); *G11C 11/4097* (2013.01)

(58) Field of Classification Search
CPC ........................ G11C 11/4097; G11C 11/4096
USPC ................................................... 365/189.011
See application file for complete search history.

(56) References Cited

U.S. PATENT DOCUMENTS

| | | | |
|---|---|---|---|
| 11,825,642 B1 | 11/2023 | Dai et al. | |
| 11,917,826 B2* | 2/2024 | Kono .................... | H10B 41/20 |
| 2007/0237001 A1* | 10/2007 | Visconti ................ | G11C 16/10 |
| | | | 365/185.23 |
| 2020/0381037 A1 | 12/2020 | Kim et al. | |

(Continued)

FOREIGN PATENT DOCUMENTS

| | | |
|---|---|---|
| JP | 2016225613 | 12/2016 |
| JP | 2018085508 | 5/2018 |

(Continued)

OTHER PUBLICATIONS

"Office Action of Korea Counterpart Application", issued on Dec. 5, 2024, p. 1-p. 7.

(Continued)

*Primary Examiner* — Connie C Yoha
(74) *Attorney, Agent, or Firm* — J.C. PATENTS

(57) ABSTRACT

A memory structure includes a plurality of first transistors and a plurality of second transistors. The first transistors are arranged in a first array. First ends of the first transistors are respectively coupled to a plurality of first bit lines, and gates of the first transistors are respectively coupled a plurality of first word lines. The second transistors are arranged in a second array. Gates of the second transistors are respectively coupled to second ends of the first transistors, and second ends and first ends of the second transistors are respectively coupled to second bit lines and second word lines. The first transistors and the second transistors are disposed on a substrate. The first word lines or the first bit lines are extended along a normal direction of a plane of the substrate, and the second word lines or the second bit lines are extended along the normal direction.

17 Claims, 8 Drawing Sheets

300

(56)     References Cited

U.S. PATENT DOCUMENTS

| | | |
|---|---|---|
| 2023/0317167 A1 | 10/2023 | Yeh et al. |
| 2023/0410908 A1 | 12/2023 | Ako |
| 2024/0107739 A1* | 3/2024 | Rassoul ............... H10B 12/482 |
| 2025/0087268 A1* | 3/2025 | Tseng .................. G11C 11/5642 |
| 2025/0308577 A1* | 10/2025 | Wang ................... H10B 12/038 |

FOREIGN PATENT DOCUMENTS

| | | |
|---|---|---|
| KR | 20190038223 | 4/2019 |
| TW | I818293 | 3/2022 |
| WO | 2023166378 | 9/2023 |

OTHER PUBLICATIONS

"Notice of Allowance of Taiwan Counterpart Application ," issued on Sep. 24, 2024, p. 1-p. 3.
"Office Action of Japan Counterpart Application", issued on Apr. 1, 2025, p. 1-p. 5.

* cited by examiner

500

MEMORY STRUCTURE AND CONTROL METHOD FOR REDUCING LAYOUT AREA OF MEMORY DEVICE

BACKGROUND

Technical Field

The disclosure relates to a memory structure and a control method for a memory device, and particularly relates to the memory structure and the control method for the memory device of a dynamic random access memory.

Description of Related Art

In the conventional technical field, the memory cell of the dynamic random access memory is often constructed by using the 1T1C architecture. In this technology, when the circuit size of the memory cell is adjusted, the complexity of the process when forming the capacitance causes great obstacles. When the memory dimension decreases, the proportion of the area of the capacitance increases significantly.

By constructing the dynamic random access memory through three-dimensional stacking, the memory capacity of the dynamic random access memory can be effectively increased. However, in the conventional 1T1C architecture, the capacitance occupies a large amount of circuit area in the three-dimensional stacked structure, which increases the production cost of the memory.

SUMMARY

The disclosure provides a memory structure, which can eliminate the need to dispose a capacitance for storing data, and the circuit area is reduced effectively.

The memory structure according to the disclosure includes multiple first transistors and multiple second transistors. The first transistors are arranged in a first array. First ends of the first transistors are respectively coupled to a plurality of first bit lines, and gates of the first transistors are respectively coupled a plurality of first word lines. The second transistors are arranged in a second array. Gates of the second transistors are respectively coupled to second ends of the first transistors, second ends of the second transistors are respectively coupled to second bit lines, and first ends of the second transistors are respectively coupled to second word lines. The first transistors and the second transistors are disposed on a substrate. One of the respective first word lines and the respective first bit lines is extended along a normal direction of a plane of the substrate, and one of the respective second word lines and the respective second bit lines is extended along the normal direction.

The control method of the memory device includes: arranging a plurality of first transistors arranged in a first array, wherein first ends of the first transistors are respectively coupled to a plurality of first bit lines, and gates of the first transistors are respectively coupled to a plurality of first word lines; arranging a plurality of second transistors arranged in a second array, wherein gates of the second transistors are respectively coupled to second ends of the first transistors, second ends of the second transistors are respectively coupled to a plurality of second bit lines, and first ends of the second transistors are respectively coupled to a plurality of second word lines; extending one of each of the first word lines and each of the first bit lines along a normal direction of a plane of the substrate to provide a first signal; and extending one of each of the second word lines and each of the second bit lines extended along a normal direction of a plane of the substrate to provide a second signal.

Based on the above, in the memory structure according to the disclosure, a memory cell comprises the first transistor and the second transistor. The coupling end of the first transistor and the second transistor can be used as a data storage node. In this way, the memory cell can be used to perform dynamic random access on memory cells, which can effectively reduce the layout area of the circuit without disposing the storage capacitance.

DESCRIPTION OF THE EMBODIMENTS

Figure 1:
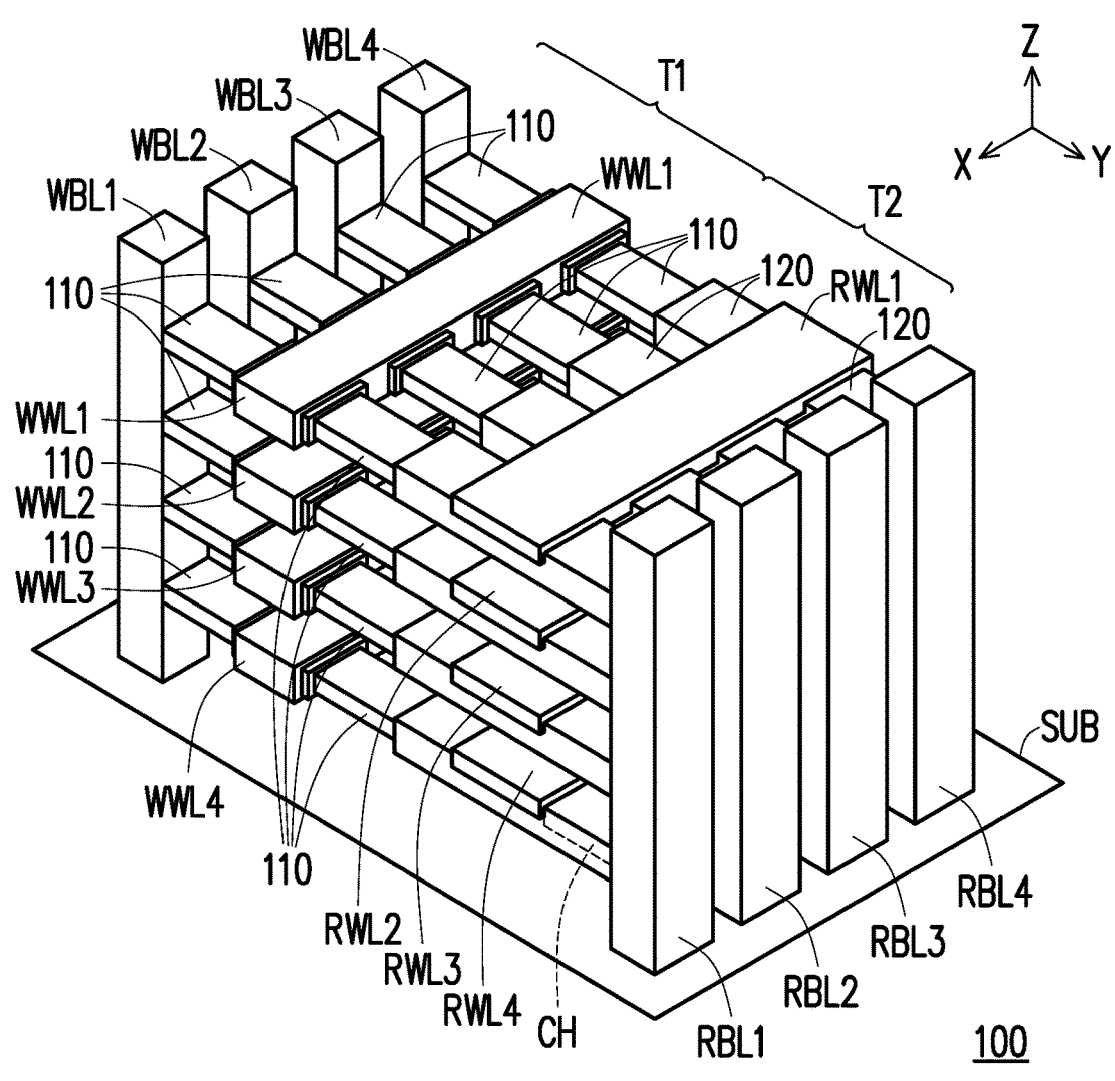
FIG. 1 is a schematic three-dimensional structure diagram of a memory structure according to an embodiment of the disclosure.

Please refer to FIG. 1. FIG. 1 is a schematic three-dimensional structure diagram of a memory structure according to an embodiment of the disclosure. A memory structure 100 is disposed on a plane of a substrate SUB. The plane of the substrate SUB is formed on an X-Y axis plane and has the same normal direction as a Z axis. The memory structure 100 includes multiple first transistors T1 and multiple second transistors T2. The first transistors T1 are arranged in a first array in a manner of N×M, and the second transistors T2 are arranged in a second array in a manner of N×M. In this embodiment, N and M may both be equal to 4. In other embodiments of the disclosure, N and M may be any other positive integers.

In this embodiment, the first array has multiple channel pillars 110 and multiple conductive structures WWL1 to WWL4. The channel pillar 110 is arranged in a manner of 4×4. Taking the X-axis direction as the row direction and the Z-axis direction as the column direction as an example, each conductive structure WWL1 to WWL4 may be extended along the row direction, and the conductive structures WWL1 to WWL4 may be disposed vertically along the column direction. The conductive structures WWL1 to WWL4 respectively surround the channel pillar 110 disposed in the same row. In this embodiment, each of the conductive structures WWL1 to WWL4 may surround four channel pillars 110 and form the common gate and word lines of four first transistors T1 corresponding to the four surrounded channel pillars 110. Incidentally, taking the conductive structure WWL1 as an example, a gate oxide layer GOX may be provided between the conductive structure WWL1 and the surrounded channel pillar 110.

In addition, in this embodiment, the first end of the channel pillar 110 may be coupled to the second transistor T2, and the second end of the channel pillar 110 may be coupled to bit lines WBL1 to WBL4 respectively formed by the conductive structures. In this embodiment, each bit line WBL1 to WBL4 may be extended along the Z axis and coupled to the second end of the multiple channel pillars 110 disposed in the same column. The bit lines WBL1 to WBL4 may be sequentially disposed along the X-axis direction. In this embodiment, the extending direction of each of the bit lines WBL1 to WBL4 may be substantially orthogonal to the extending direction of each of the conductive structures WWL1 to WWL4 forming the word lines. It is worth noting that, the extending directions of each of the bit lines WBL1 to WBL4 and each of the conductive structures WWL1 to WWL4 may not be accurately orthogonal to each other due to the tolerance caused by the manufacturing process, and thus form a substantially orthogonal state.

On the other hand, the second array has multiple gate structures, multiple conductive structures 120 and RWL1 to RWL4. In this embodiment, the channel pillar 110 may be extended into the second array along the Y-axis and form the corresponding gate structure. That is to say, each channel pillar 110 and each corresponding gate structure may be the same structure body. In this embodiment, based on the channel pillar 110 being arranged in a manner of 4×4, the gate structure is also arranged in a manner of 4×4. The multiple conductive structures 120 correspond to the gate structures respectively, extend along the Y-axis direction to surround the corresponding gate structures respectively, and form the gate of the multiple second transistors T2. Similarly, a gate oxide layer (not shown) may be provided between each conductive structure 120 and each surrounded gate structure.

In addition, each conductive structure RWL1 to RWL4 is extended along the X-axis direction. The conductive structures RWL1 to RWL4 are disposed vertically along the Z-axis direction. Each of the conductive structures RWL1 to RWL4 covers four conductive structures 120 disposed in the same row and forms a common word line of multiple second transistors T2 arranged in the same row. Each bit line RBL1 to RBL4 may be extended along the Z-axis direction and coupled to an end of the multiple conductive structures 120 disposed in the same column. The bit lines RBL1 to RBL4 are disposed along the Z-axis direction.

It is worth mentioning that, in this embodiment, on the conductive structure 120, a channel may be formed between each conductive structure RWL1 to RWL4 and each bit line RBL1 to RBL4 (such as a channel CH between the conductive structure RWL4 and the bit line RBL1).

In this embodiment, the extending direction of each of bit lines RBL1 to RBL4 may be substantially orthogonal to the extending direction of each of the conductive structures RWL1 to RWL4 forming the word lines. It is worth noting that, the extending directions of each of the bit lines RBL1 to RBL4 and each of the conductive structures RWL1 to RWL4 may not be accurately orthogonal to each other due to the tolerance caused by the manufacturing process, and thus form a substantially orthogonal state.

In addition, in this embodiment, based on the tolerance caused by manufacturing, the extending directions of the conductive structures WWL1 to WWL4 and the conductive structures RWL1 to RWL4 are substantially the same. Also, the extending directions of the bit lines WBL1 to WBL4 and the bit lines RBL1 to RBL4 are substantially the same.

It is worth mentioning that, in this embodiment, the material of the channel pillar 110 may be silicon, gallium arsenide, silicon carbide, or other suitable semiconductor channel materials, and the conductive structures 120, WWL1 to WWL4, and RWL1 to RWL4 may be any conductive structures in the semiconductor manufacturing process, and the disclosure is not limited thereto. The first transistor T1 of this embodiment may be a gate all-around (GAA) transistor, and the second transistor T2 may be a channel all-around (CAA) transistor.

Figure 2:
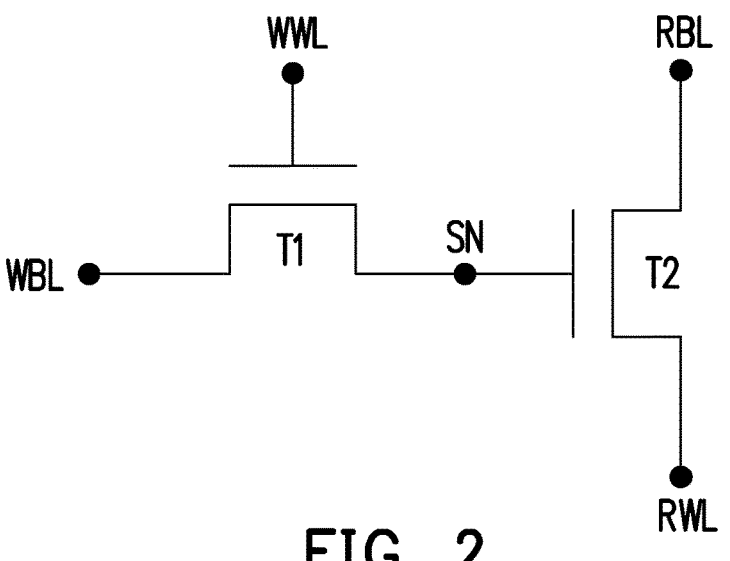
FIG. 2 is the equivalent circuit diagram of a memory cell in the memory structure according to an embodiment of the disclosure.

In the following description, please refer to FIG. 2. FIG. 2 is the equivalent circuit diagram of a memory cell in the memory structure according to an embodiment of the disclosure. A memory cell 200 includes a first transistor T1 and a second transistor T2. The first end of the first transistor T1 is coupled to a bit line WBL; the second end of the first transistor T1 is coupled to a data storage node SN; and the gate of the first transistor T1 is coupled to the word line formed by a conductive structure WWL. The first end of the second transistor T2 is coupled to the bit line RBL; the second end of the second transistor T2 is coupled to the word line formed by the conductive structure RWL; and the gate of the second transistor T2 is coupled to the data storage node SN.

In the write mode of data, the first transistor T1 may be turned on according to the control signal transmitted by the conductive structure WWL. The first end of the first transistor T1 may receive written data through the bit line WBL and write the written data to the data storage node SN through the turned on first transistor T1.

In the read mode of data, the first transistor T1 may be turned off. The second end of the second transistor T2 may receive a selected voltage for initiating the read operation through the conductive structure RWL. At the same time, the second transistor T2 may be turned on or turned off based on the data stored in the data storage node SN. For example, if the data stored in the data storage node SN is a high logic value, the second transistor T2 may be turned on. In this way, the second transistor T2 can provide the corresponding read current on the bit line RBL. By disposing a sense amplifier to sense the read current, it may be known that the data stored in the data storage node SN is a high logic value. In contrast, taking the data stored in the data storage node SN being a low logic value as an example, the second transistor T2 may be turned off. As a result, the corresponding read current provided by the second transistor T2 on the bit line RBL is substantially equal to 0. The sense amplifier can know that the data stored in the data storage node SN is a low logic value by sensing the read current which is substantially equal to 0.

Figure 3:
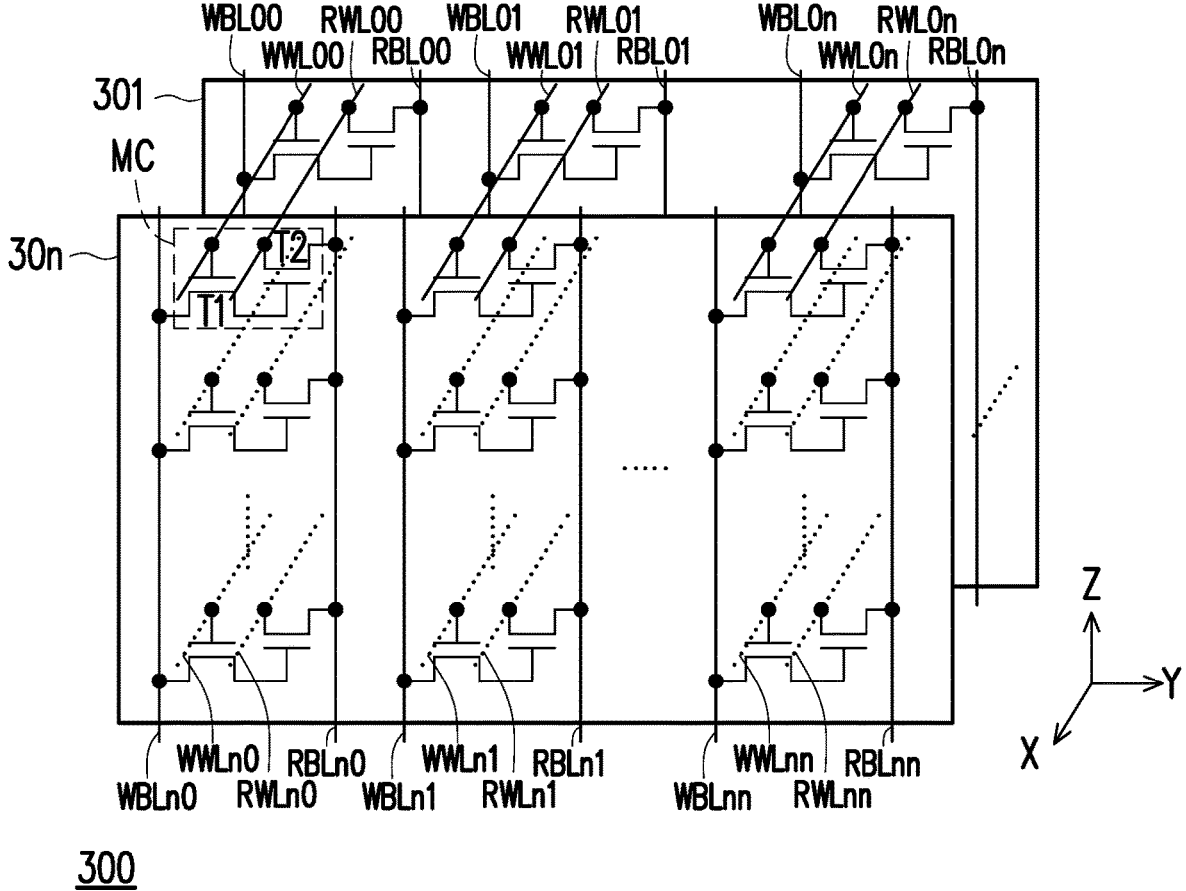
FIG. 3 is a schematic circuit diagram of a memory cell array formed by the memory structure in FIG. 1 according to an embodiment of the disclosure.

Please refer to FIG. 3. FIG. 3 is a schematic circuit diagram of a memory cell array formed by the memory structure in FIG. 1 according to an embodiment of the disclosure. A memory cell array 300 has multiple memory cell slices 301 to 30n. Each memory cell slice 301 to 30n includes a memory cell array comprising multiple memory cells MC (merely one is shown as a representative illustration in the drawing), in which each memory cell MC includes a first transistor T1 and a second transistor T2. The memory cell slice 301 has multiple bit lines WBL_00 to WBL_0n extending along the Z-axis and multiple bit lines RBL_00 to RBL_0$n$ extending along the Z-axis. The bit lines WBL_00 to WBL_0$n$ are coupled to the first transistor T1, and the bit lines RBL_00 to RBL_0$n$ are coupled to the second transistor T2. Similarly, the memory cell slice 30$n$ has multiple bit lines WBL_$n$0 to WBL_$nn$ extending along the Z-axis and multiple bit lines RBL_$n$0 to RBL_$nn$ extending along the Z-axis. The bit lines WBL_$n$0 to WBL_$nn$ are coupled to the first transistor T1, and the bit lines RBL_$n$0 to RBL_$nn$ are coupled to the second transistor T2.

The conductive structures WWL_00 to WWL_$nn$ and RWL_00 to RWL_$nn$ for forming the word line may be extended along the X-axis and cross connected between the multiple memory cell slices 301 to 30$n$. The conductive structures WWL_00 to WWL_$nn$ are coupled to the first transistor T1, and the conductive structures RWL_00 to RWL_$nn$ are coupled to the second transistor T2.

During a data write mode, for a selected memory cell, a selected write word line (at least one of the conductive structures WWL_00 to WWL_$nn$) may provide a word line signal equal to a voltage V1, and a write bit line corresponding to the selected memory cell (at least one of bit lines WBL_00 to WBL_$nn$) may provide a bit line signal equal to the voltage V1 or a voltage V2 according to logic value 0 or 1 of written data, where the voltage V1 may be 3V and the voltage V2 may be 0V. Relatively, for unselected memory cells, unselected word lines and bits lines can provide signals with 0V. During a hold mode, voltages on all of the bit lines and word lines are 0V. In a data readout mode, a read word line (at least one of the conductive structures RWL_00 to RWL_$nn$) may provide the word line signal equal to a voltage V3, and a voltage RV on a read bit line (at least one of bit lines RBL_00 to RBL_$nn$) may be decide by a stored logic value of corresponding selected memory cell. Wherein, the voltage V3 may be smaller than the voltage V1, and for example the voltage V3 may be 1V. Detail of operation can be seen as a truth table shown as below:

| | Write 1 | Write 0 | Hold | Read |
|---|---|---|---|---|
| Selected write word line | 3 V | 3 V | 0 V | 0 V |
| Unselected write word line | 0 V | 0 V | 0 V | 0 V |
| Selected write bit line | 3 V | 0 V | 0 V | 0 V |
| Read word line | 0 V | 0 V | 0 V | 1 V |
| Read bit line | 0 V | 0 V | 0 V | R V |

Figure 4:
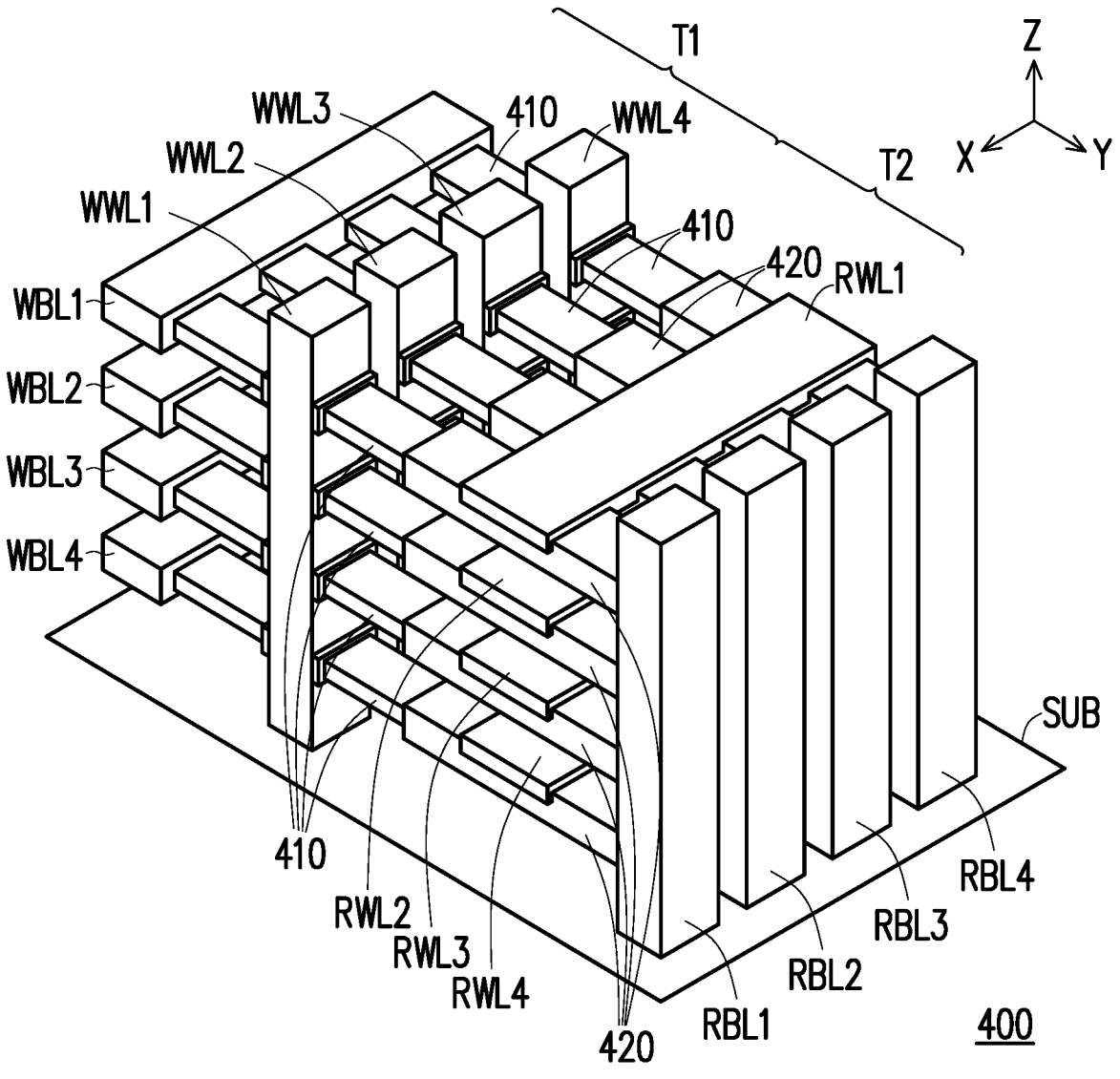
FIG. 4 is a schematic three-dimensional structure diagram of a memory structure according to another embodiment of the disclosure.

Please refer to FIG. 4. FIG. 4 is a schematic three-dimensional structure diagram of a memory structure according to another embodiment of the disclosure. A memory structure 400 is disposed on the plane of the substrate SUB. The plane of the substrate SUB is formed on the X-Y axis plane and has the same normal direction as the Z-axis. The memory structure 400 includes the multiple first transistors T1 and the multiple second transistors T2. The first transistors T1 are arranged in a first array in a manner of N×M, and the second transistors T2 are arranged in a second array in a manner of N×M. In this embodiment, N and M may both be equal to 4. In other embodiments of the disclosure, N and M may be any other positive integers.

The following description takes the X-axis direction as the row direction and the Z-axis direction as the column direction. The structure of the first transistor T1 and the second transistor T2 of this embodiment is similar to the embodiment of FIG. 1. It is worth noting that, in this embodiment, each of the multiple bit lines WBL1 to WBL4 coupled to the first transistor T1 is extended along the X-axis and coupled to multiple channel pillars 410 arranged in the same row. The bit lines WBL1 to WBL4 are dispose vertically along the Z-axis direction. Each of the conductive structures WWL1 to WWL4 is extended along the Z-axis direction and surrounds the multiple channel pillars 410 arranged in the same column to form a common gate of the multiple first transistors T1 arranged in the same column. The conductive structures WWL1 to WWL4 are disposed along the X-axis direction.

In addition, each of the plurality of bit lines RBL1 to RBL4 coupled to the second transistor T2 is extended along the Z-axis direction. The bit lines RBL1 to RBL4 are disposed along the X-axis direction. Each of the bit lines RBL1 to RBL4 is coupled to an end of multiple conductive structures 420 arranged in the same column. Each conductive structure RWL1 to RWL4 is extended along the X-axis direction and covers the multiple conductive structures 420 arranged in the same row to form the word line of the multiple second transistors T2 arranged in the same row. The conductive structures RWL1 to RWL4 are disposed vertically along the Z-axis direction.

In this embodiment, multiple word lines formed by the conductive structures WWL1 to WWL4 and each of the bit lines RBL1 to RBL4 are extended along the normal direction (that is, the Z-axis direction) of the plane of the substrate SUB.

Figure 5:
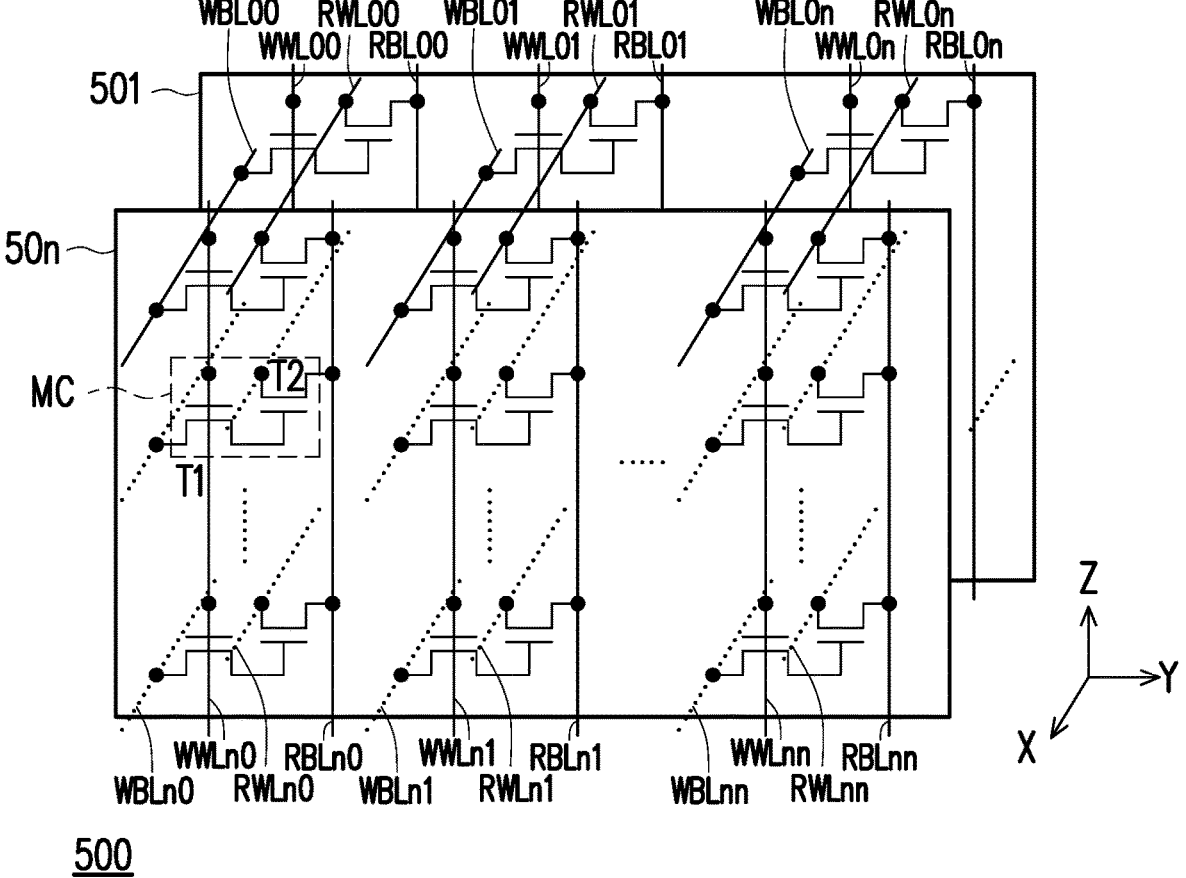
FIG. 5 is a schematic circuit diagram of a memory cell array formed by the memory structure in FIG. 4 according to an embodiment of the disclosure.

Please refer to FIG. 5. FIG. 5 is a schematic circuit diagram of a memory cell array formed by the memory structure in FIG. 4 according to an embodiment of the disclosure. A memory cell array 500 has multiple memory cell slices 501 to 50$n$. Each memory cell slice 501 to 50$n$ includes a memory cell array comprising multiple memory cells MC, in which each memory cell MC includes a first transistor T1 and a second transistor T2. The memory cell slice 501 has multiple conductive structures WWL_00 to WWL_0$n$ extended along the Z-axis to form word lines, and multiple bit lines RBL_00 to RBL_0$n$ extended along the Z-axis. The conductive structures WWL_00 to WWL_0$n$ are coupled to the control end of the first transistor T1, and the bit lines RBL_00 to RBL_0$n$ are coupled to the second transistor T2. Similarly, the memory cell slice 50$n$ has multiple conductive structures WWL_$n$0 to WWL_$nn$ extended along the Z-axis to form word lines and multiple bit lines RBL_$n$0 to RBL_$nn$ extended along the Z-axis. The conductive structures WWL_$n$0 to WWL_$nn$ are coupled to the control end of the first transistor T1, and the bit lines RBL_$n$0 to RBL_$nn$ are coupled to the second transistor T2.

The bit lines WBL_00 to WBL_$nn$ and the conductive structures RWL_00 to RWL_$nn$ used for forming the word lines may be extended along the X-axis direction and cross connected between the multiple memory cell slices 501 to 50$n$. The bit lines WBL_00 to WBL_$nn$ are coupled to the first transistor T1, and the conductive structures RWL_00 to RWL_$nn$ are coupled to the second transistor T2.

Figure 6:
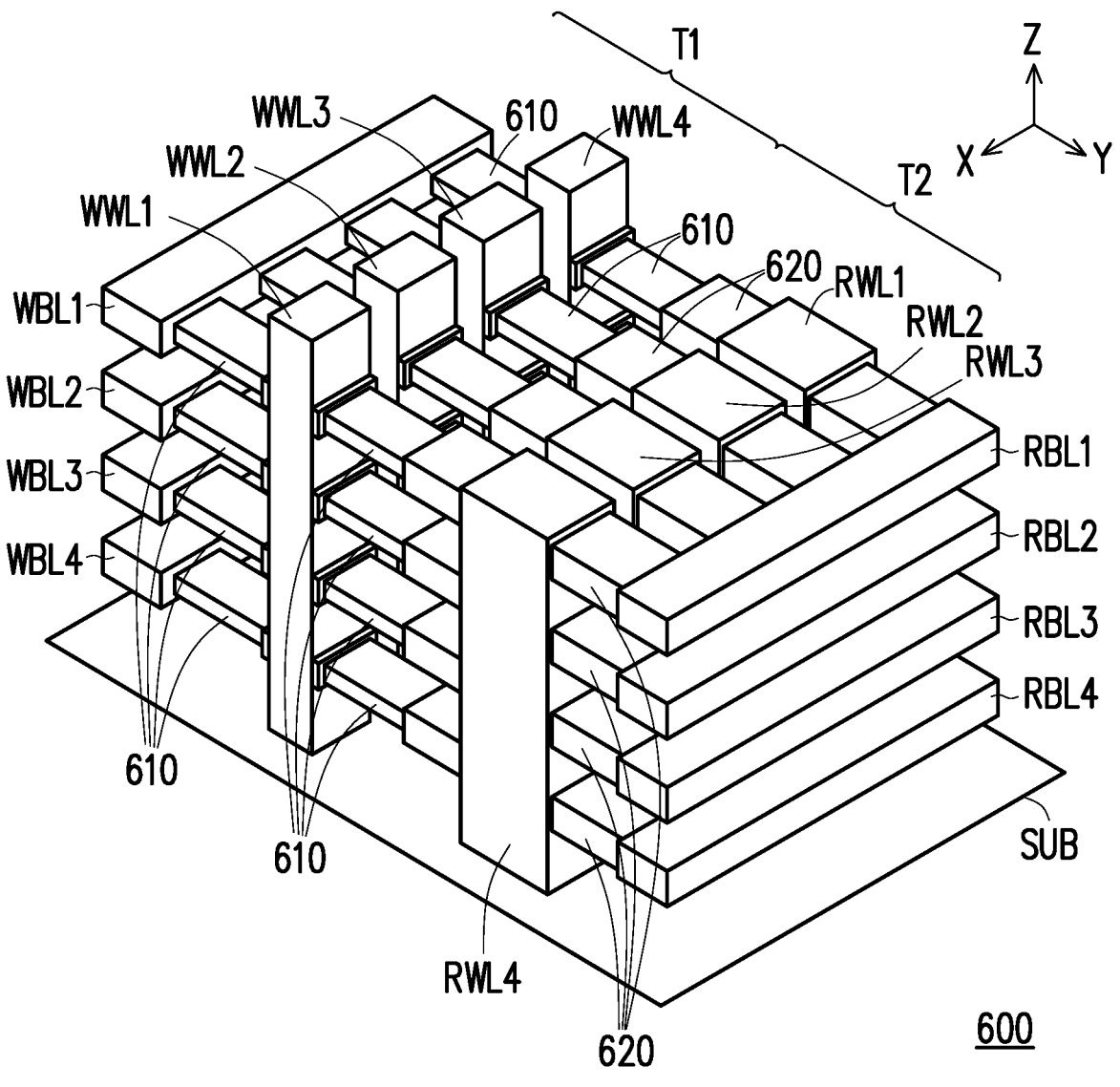
FIG. 6 is a schematic three-dimensional structure diagram of a memory structure according to another embodiment of the disclosure.

Please refer to FIG. 6. FIG. 6 is a schematic three-dimensional structure diagram of a memory structure according to another embodiment of the disclosure. A memory structure 600 is disposed on the plane of substrate SUB. The plane of the substrate SUB is formed on the X-Y axis plane and has the same normal direction as the Z-axis. The memory structure 600 includes the multiple first transistors T1 and the multiple second transistors T2. The first transistors T1 are arranged in a first array in a manner of N×M, and the second transistor T2 are arranged in a second array in a manner of N×M. In this embodiment, N and M may both be equal to 4. In other embodiments of the disclosure, N and M may be any other positive integers.

The following description takes the X-axis direction as the row direction and the Z-axis direction as the column direction. The structure of the first transistor T1 and the second transistor T2 of this embodiment is similar to the embodiment of FIG. 1 and FIG. 4. It is worth noting that, in this embodiment, each of the multiple bit lines WBL1 to WBL4 coupled to the first transistor T1 is extended along the X-axis and coupled to multiple channel pillars 610 arranged in the same row. The bit lines WBL1 to WBL4 are disposed vertically along the Z-axis direction. Each of the conductive structures WWL1 to WWL4 is extended along the Z-axis direction and surrounds the multiple channel pillars 610 arranged in the same column to form a common gate of the multiple first transistors T1 arranged in the same column. The conductive structures WWL1 to WWL4 are disposed sequentially along the X-axis direction.

In addition, each of the plurality of bit lines RBL1 to RBL4 coupled to the second transistor T2 is extended along the X-axis direction. The bit lines RBL1 to RBL4 are disposed vertically along the Z-axis direction. Each of the bit lines RBL1 to RBL4 is coupled to an end of multiple conductive structures 620 arranged in the same row. Each conductive structure RWL1 to RWL4 is extended along the Z-axis direction, covers and surrounds the multiple conductive structures 620 arranged in the same row to form the word line of the multiple second transistor T2 arranged in the same column. The conductive structures RWL1 to RWL4 are disposed sequentially along the X-axis direction.

In this embodiment, each of the multiple word lines formed by the conductive structures WWL1 to WWL4 and RWL1 to RWL4 is extended along the normal direction (that is, the Z-axis direction) of the plane of the substrate SUB.

Figure 7:
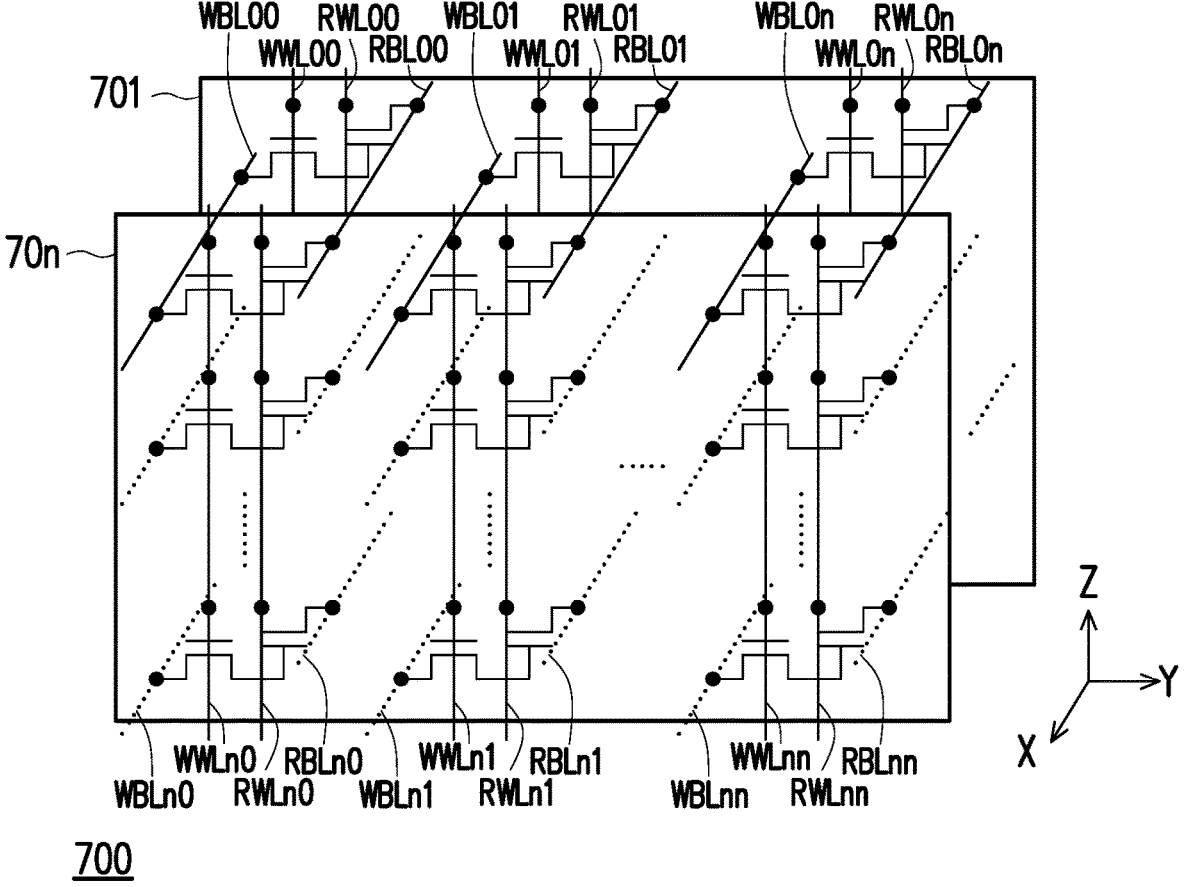
FIG. 7 is a schematic circuit diagram of a memory cell array formed by the memory structure in FIG. 6 according to an embodiment of the disclosure.

Please refer to FIG. 7. FIG. 7 is a schematic circuit diagram of a memory cell array formed by the memory structure in FIG. 6 according to an embodiment of the disclosure. A memory cell array 700 has multiple memory cell slices 701 to 70$n$. Each memory cell slice 701 to 70$n$ includes a memory cell array comprising multiple memory cells MC, in which each memory cell MC includes a first transistor T1 and a second transistor T2. The memory cell slice 701 has a plurality of conductive structures WWL_00 to WWL_0$n$ extended along the Z-axis to form word lines and a plurality of conductive structures RWL_00 to RWL_0$n$ extended along the Z-axis to form word lines. The conductive structures WWL_00 to WWL_0$n$ are coupled to the control end of the first transistor T1, and the conductive structures RWL_00 to RWL_0$n$ are coupled to the control end of the second transistor T2. Similarly, the memory cell slice 70$n$ has multiple conductive structures WWL_$n$0 to WWL_nn extended along the Z-axis to form word lines and multiple conductive structures RWL_$n$0 to RWL_nn extended along the Z-axis to form word lines. The conductive structures WWL_$n$0 to WWL_nn are coupled to the control end of the first transistor T1, and the conductive structures RWL_$n$0 to RWL_nn are coupled to the control end of the second transistor T2.

The bit lines WBL_00 to WBL_nn and the conductive structures RWL_00 to RWL_nn for forming the word lines may be extended along the X-axis direction and cross connected between the multiple memory cell slices 701 to 70$n$. The bit line WBL_00 to WBL_nn are coupled to the first transistor T1, and the conductive structures RWL_00 to RWL_nn are coupled to the second transistor T2.

Figure 8:
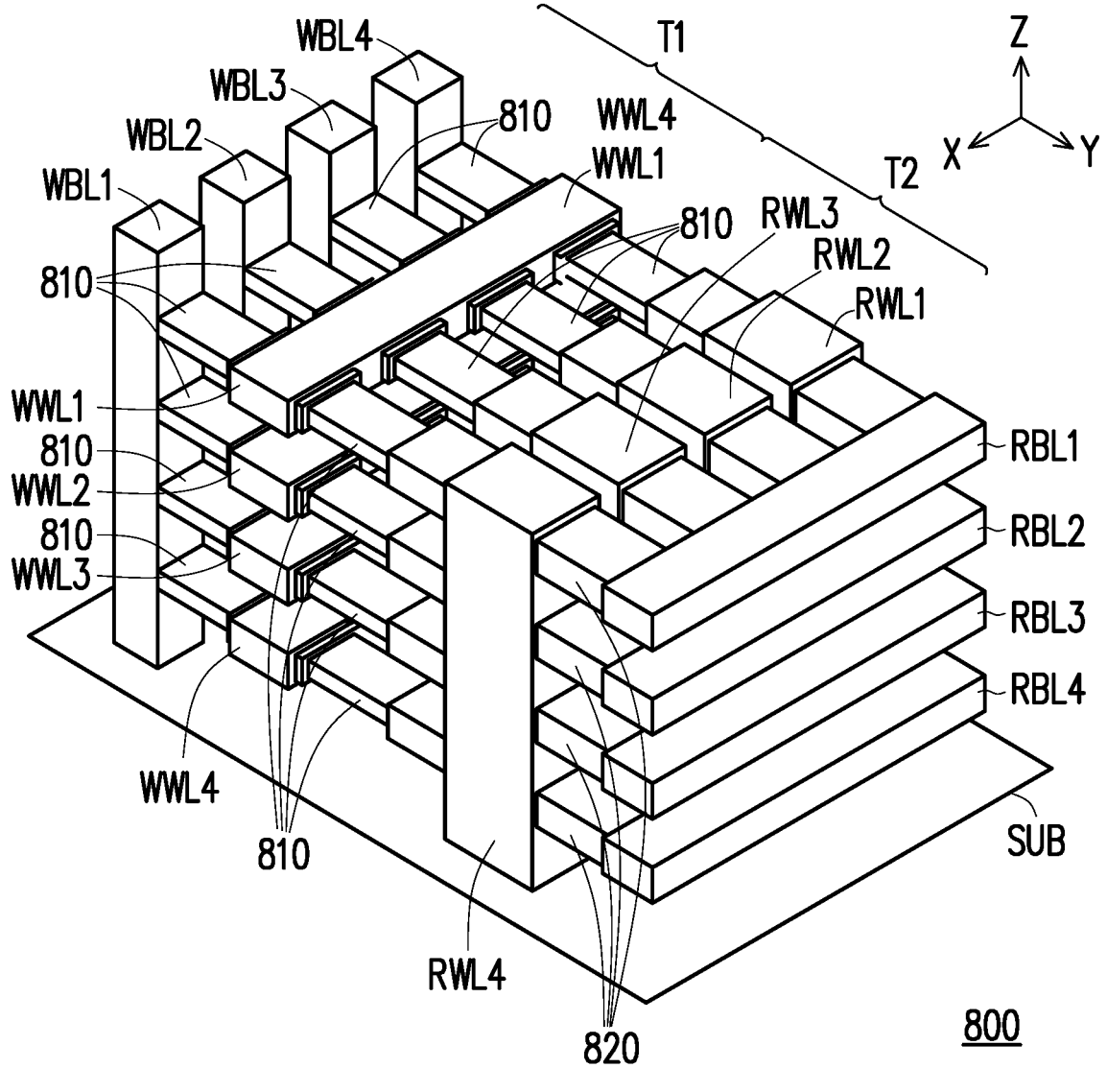
FIG. 8 is a schematic three-dimensional structure diagram of a memory structure according to another embodiment of the disclosure.

Please refer to FIG. 8. FIG. 8 is a schematic three-dimensional structure diagram of a memory structure according to another embodiment of the disclosure. A memory structure 800 is disposed on the plane of the substrate SUB. The plane of the substrate SUB is formed on the X-Y axis plane and has the same normal direction as the Z-axis. The memory structure 800 includes the multiple first transistors T1 and the multiple second transistors T2. The first transistors T1 are arranged in a first array in a manner of N×M, and the second transistor T2 are arranged in a second array in a manner of N×M. In this embodiment, N and M may both be equal to 4. In other embodiments of the disclosure, N and M may be any other positive integers.

The following description takes the X-axis direction as the row direction and the Z-axis direction as the column direction. The structure of the first transistor T1 and the second transistor T2 of this embodiment is similar to the embodiment of FIG. 1, FIG. 4, and FIG. 6. It is worth noting that, in this embodiment, each of the multiple bit lines WBL1 to WBL4 coupled to the first transistor T1 is extended along the Z-axis and coupled to multiple channel pillars 810 arranged in the same row. The bit lines WBL1 to WBL4 are disposed sequentially along the X-axis direction. Each of the conductive structures WWL1 to WWL4 is extended along the X-axis direction and surrounds the multiple channel pillars 810 in the same column to form a common gate of the multiple first transistor T1 arranged in the same row. The conductive structures WWL1 to WWL4 are disposed vertically along the Z-axis direction.

In addition, each of the plurality of bit lines RBL1 to RBL4 coupled to the second transistor T2 is extended along the X-axis direction. The bit lines RBL1 to RBL4 are disposed vertically along the Z-axis direction. Each of the bit lines RBL1 to RBL4 is coupled to an end of multiple conductive structures 820 arranged in the same row. Each conductive structure RWL1 to RWL4 is extended along the Z-axis direction, covers and surrounds the multiple conductive structures 820 arranged in the same row to form the word line of the multiple second transistor T2 arranged in the same column. The conductive structures RWL1 to RWL4 are disposed sequentially along the X-axis direction.

In this embodiment, each of the multiple word lines formed by the bit lines WBL1 to WBL4 and conductive structures RWL1 to RWL4 is extended along the normal direction (that is, the Z-axis direction) of the plane of the substrate SUB.

Figure 9:
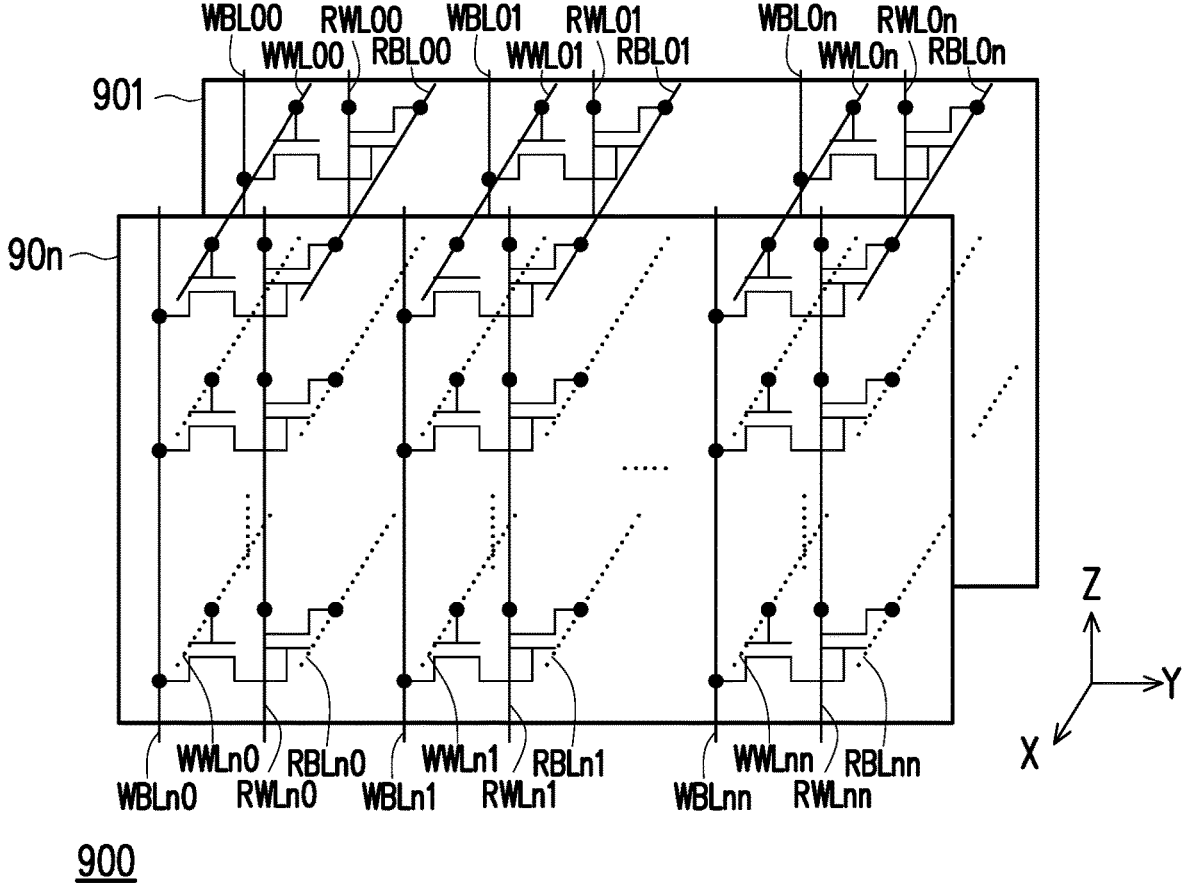
FIG. 9 is a schematic circuit diagram of a memory cell array formed by the memory structure in FIG. 8 according to an embodiment of the disclosure.

Please refer to FIG. 9. FIG. 9 is a schematic circuit diagram of a memory cell array formed by the memory structure in FIG. 8 according to an embodiment of the disclosure. A memory cell array 900 has multiple memory cell slices 901 to 90$n$. Each memory cell slice 901 to 90$n$ includes a memory cell array comprising multiple memory cells MC, in which each memory cell MC includes a first transistor T1 and a second transistor T2. The memory cell slice 901 has multiple bit lines WBL1_00 to WBL_0$n$ extended along the Z-axis and multiple conductive structures RWL_00 to RWL_0$n$ extended along the Z axis to form word lines. The bit lines WBL1_00 to WBL_0$n$ are coupled to the first transistor T1, and the conductive structures RWL_00 to RWL_0$n$ are coupled to the control end of the second transistor T2. Similarly, the memory cell slice 90$n$ has multiple bit lines WBL1_$n$0 to WBL_nn extended along the Z-axis and multiple conductive structures RWL_$n$0 to RWL_nn extended along the Z-axis to form word lines. The bit lines WBL1_$n$0 to WBL_nn are coupled to the control end of the first transistor T1, and the conductive structures RWL_$n$0 to RWL_nn are coupled to the control end of the second transistor T2.

The bit lines RBL_00 to RBL_nn and the conductive structures WWL_00 to WWL_nn for forming the word lines may be extended along the X-axis direction and cross connected between the multiple memory cell slices 901 to 90$n$. The bit lines RBL_00 to RBL_nn are coupled to the second transistor T2, and the conductive structures WWL_00 to WWL_nn are coupled to the first transistor T1.

In summary, the memory structure according to the disclosure forms a memory cell by two transistors. In this way, there is no need to dispose the storage capacitance for each memory cell, and the circuit area can be effectively saved. In addition, the memory structure according to the disclosure is vertically disposed with word lines or bit lines. In the manufacturing process, there is no need to define the word line or the bit line vertically disposed layer by layer, and the process of the word line or the bit line vertically disposed can be completed through one-time etching, thereby effectively reducing the complexity of the process, and the manufacturing cost can be effectively reduced.

What is claimed is:

1. A memory structure, comprising:
a plurality of first transistors arranged in a first array, wherein first ends of the first transistors are respectively coupled to a plurality of first bit lines, and gates of the first transistors are respectively coupled to a plurality of first word lines; and
a plurality of second transistors arranged in a second array, wherein gates of the second transistors are respectively coupled to second ends of the first transistors, second ends of the second transistors are respectively coupled to a plurality of second bit lines, and first ends of the second transistors are respectively coupled to a plurality of second word lines,
wherein the first transistors and the second transistors are disposed on a substrate, one of the each of the first word lines and each of the first bit line is extended along a normal direction of a plane of the substrate, and one of the each of the second word line and the each of the second bit lines is extended along the normal direction, wherein the first array comprises:
N×M channel pillars, wherein N and M are positive integers; and
M first conductive structures, wherein each of the first conductive structures surrounds N of the channel pillars, and each of the first conductive structures forms a common gate and each of the first word lines of the first transistors corresponding to the N channel pillars.

2. The memory structure as claimed in claim 1, wherein extending directions of each of the first word lines and each of the first bit lines are substantially orthogonal to each other, and extending directions of each of the second word lines and each of the second bit lines are substantially orthogonal to each other.

3. The memory structure as claimed in claim 1, wherein the second array comprises:
N×M gate structures having a plurality of first ends respectively coupled to first ends of the corresponding N×M channel pillars; and
N×M second conductive structures respectively surrounding the gate structures; and
M third conductive structures, wherein each of the third conductive structures covers N of the second conductive structures, and the third conductive structures respectively form the second word lines.

4. The memory structure as claimed in claim 3, wherein each of the first bit lines is coupled to a second end of the corresponding channel pillars.

5. The memory structure as claimed in claim 3, wherein each of the second bit lines is coupled to a second end of the corresponding gate structures.

6. The memory structure as claimed in claim 5, wherein on each of the second conductive structures, a channel of each of the second transistors is formed between each of the third conductive structures and each of the second bit lines.

7. The memory structure as claimed in claim 3, wherein each of the gate structures and each of the corresponding channel pillars are the same structure body.

8. The memory structure as claimed in claim 3, wherein extending directions of each of the first word lines and each of the second word lines are substantially the same, and extending directions of each of the first bit lines and each of the second bit lines are substantially the same.

9. The memory structure as claimed in claim 1, wherein the second array comprises:
N×M gate structures having a plurality of first ends respectively coupled to first ends of the corresponding N×M channel pillars; and
N×M second conductive structures respectively surrounding the gate structures; and
N third conductive structures, wherein each of the third conductive structures surrounds M of the second conductive structures, and the third conductive structures respectively form the second word lines.

10. The memory structure as claimed in claim 9, wherein extending directions of each of the first word lines and each of the second word lines are substantially orthogonal to each other, and extending directions of each of the first bit lines and each of the second bit lines are substantially orthogonal to each other.

11. The memory structure as claimed in claim 1, wherein a coupling end of each of the first transistors and each of the second transistors is a data storage node.

12. The memory structure as claimed in claim 11, wherein in a write mode, each of the first transistors is turned on, and written data received by the first end of each of the transistors is written to the corresponding data storage node.

13. The memory structure as claimed in claim 11, wherein in a read mode, each of the second transistors is turned on or turned off according to the data stored in the corresponding data storage node, and the second end of each of the transistors is configured to provide read data.

14. The memory structure as claimed in claim 1, wherein each of the first transistors is a gate all-around (GAA) transistor, and each of the second transistors is a channel all-around (CAA) transistor.

15. A control method of a memory device, comprising:
arranging a plurality of first transistors arranged in a first array, wherein first ends of the first transistors are respectively coupled to a plurality of first bit lines, and gates of the first transistors are respectively coupled to a plurality of first word lines;
arranging a plurality of second transistors arranged in a second array, wherein gates of the second transistors are respectively coupled to second ends of the first transistors, second ends of the second transistors are respectively coupled to a plurality of second bit lines, and first ends of the second transistors are respectively coupled to a plurality of second word lines;
extending one of each of the first word lines and each of the first bit lines along a normal direction of a plane of the substrate to provide a first signal; and
extending one of each of the second word lines and each of the second bit lines extended along a normal direction of a plane of the substrate to provide a second signal,
wherein the first array comprises:
N×M channel pillars, wherein N and M are positive integers; and M first conductive structures, wherein each of the first conductive structures surrounds N of the channel pillars, and each of the first conductive structures forms a common gate and each of the first word lines of the first transistors corresponding to the N channel pillars.

16. The control method as claimed in claim 15, wherein each of the first word line provides a first word line signal to be the first signal, each of the second word line provides a second word line signal to be the second signal, each of the first bit line provides a first bit line signal to be the first signal, each of the second bit line provides a second bit line signal to be the second signal.

17. A memory structure, comprising:

a plurality of first transistors arranged in a first array, wherein first ends of the first transistors are respectively coupled to a plurality of first bit lines, and gates of the first transistors are respectively coupled to a plurality of first word lines; and a plurality of second transistors arranged in a second array, wherein gates of the second transistors are respectively coupled to second ends of the first transistors, second ends of the second transistors are respectively coupled to a plurality of second bit lines, and first ends of the second transistors are respectively coupled to a plurality of second word lines, wherein the first transistors and the second transistors are disposed on a substrate, one of the each of the first word lines and each of the first bit line is extended along a normal direction of a plane of the substrate, and one of the each of the second word line and the each of the second bit lines is extended along the normal direction, wherein each of the first transistors is a gate all-around (GAA) transistor, and each of the second transistors is a channel all-around (CAA) transistor.

* * * * *